United States Patent
Nakatsuka et al.

(10) Patent No.: US 9,842,948 B2
(45) Date of Patent: Dec. 12, 2017

(54) SOLAR CELL

(71) Applicant: Panasonic Intellectual Property Management Co., Ltd., Osaka (JP)

(72) Inventors: Yayoi Nakatsuka, Osaka (JP); Hironobu Tsujimoto, Osaka (JP); Azumi Umeda, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/940,266

(22) Filed: Nov. 13, 2015

(65) Prior Publication Data

US 2016/0071985 A1 Mar. 10, 2016

Related U.S. Application Data

(63) Continuation of application No. PCT/JP2014/063972, filed on May 27, 2014.

(30) Foreign Application Priority Data

Jun. 4, 2013 (JP) ................ 2013-117845

(51) Int. Cl.
*H01L 31/00* (2006.01)
*H01L 31/0224* (2006.01)
*H01L 31/0747* (2012.01)

(52) U.S. Cl.
CPC .. *H01L 31/022425* (2013.01); *H01L 31/0747* (2013.01); *Y02E 10/50* (2013.01)

(58) Field of Classification Search
CPC ............. H01L 31/00; H01L 31/022425; H01L 31/0747
See application file for complete search history.

(56) References Cited

U.S. PATENT DOCUMENTS 6,091,019 A 7/2000 Sakata et al.
2005/0109388 A1* 5/2005 Murakami ........ H01L 31/03682
136/255
(Continued)

FOREIGN PATENT DOCUMENTS

JP H11-103084 A 4/1999
JP 2007-224191 A 9/2007
(Continued)

OTHER PUBLICATIONS

JP2007224191 (English translation).*

*Primary Examiner* — Uyen Tran
(74) *Attorney, Agent, or Firm* — Metrolexis Law Group, PLLC

(57) ABSTRACT

An solar cell is provided comprising a photoelectric conversion layer formed on a substrate formed of a semiconductor material, and a first finger electrode formed of printed conductive paste to a main surface side of the photoelectric conversion layer, wherein an average of standard deviations of heights of unevenness on a surface of the first finger electrode is 5.0 µm or less. The first finger electrode may be formed on a back surface side of the solar cell opposite to a light-receiving surface side. The substrate may be a crystalline silicon substrate. The photoelectric conversion layer may comprise the crystalline silicon substrate, an amorphous silicon layer formed on the substrate, and a transparent conductive oxide film formed on the amorphous silicon layer. The first finger electrode may be provided on the transparent conductive oxide film.

16 Claims, 5 Drawing Sheets

(56) References Cited

U.S. PATENT DOCUMENTS

| | | | | |
|---|---|---|---|---|
| 2005/0150543 | A1* | 7/2005 | Nakashima | H01L 31/022425 136/256 |
| 2009/0250106 | A1* | 10/2009 | Hayashi | H01L 31/022425 136/256 |
| 2012/0145237 | A1* | 6/2012 | Tanaka | H01B 1/22 136/256 |

FOREIGN PATENT DOCUMENTS

| | | |
|---|---|---|
| JP | 2009-021330 A | 1/2009 |
| JP | 2011-061109 A | 3/2011 |
| WO | 2013076861 A1 | 5/2013 |

* cited by examiner

SOLAR CELL

CROSS REFERENCE TO RELATED APPLICATIONS

This application is a continuation application of International Application No. PCT/JP2014/063972, filed on May 27, 2014, entitled "SOLAR CELL", which claims priority based on the Article 8 of Patent Cooperation Treaty from prior Japanese Patent Applications No. 2013-117845, filed on Jun. 4, 2013, the entire contents of which are incorporated herein by reference.

BACKGROUND

The disclosure relates to a solar cell.

Generally, collective electrodes such as finger electrodes and busbar electrodes formed on a surface of a solar cell are formed by applying conductive paste to the surface of the solar cell by a printing technique such as screen printing.

Japanese Patent Application Publication No. Hei 11-103084 (Patent Document 1) proposes that when collective electrodes are formed, a screen printing process is repeated a plurality of times to reduce unevenness on surfaces of the collective electrodes and reduce the resistance values thereof. Japanese Patent Application Publication No. 2007-224191 (Patent Document 2) proposes that collective electrodes are formed using a conductive paste composition containing silicone resin.

SUMMARY

An embodiment of a solar cell includes a photoelectric conversion layer formed on a substrate made of a semiconductor material; and a first finger electrode formed by applying conductive paste to a main surface side of the photoelectric conversion layer by printing, an average of standard deviations of heights of unevenness on a surface of the first finger electrode being 5.0 μm or less.

DETAILED DESCRIPTION

Figure 1:
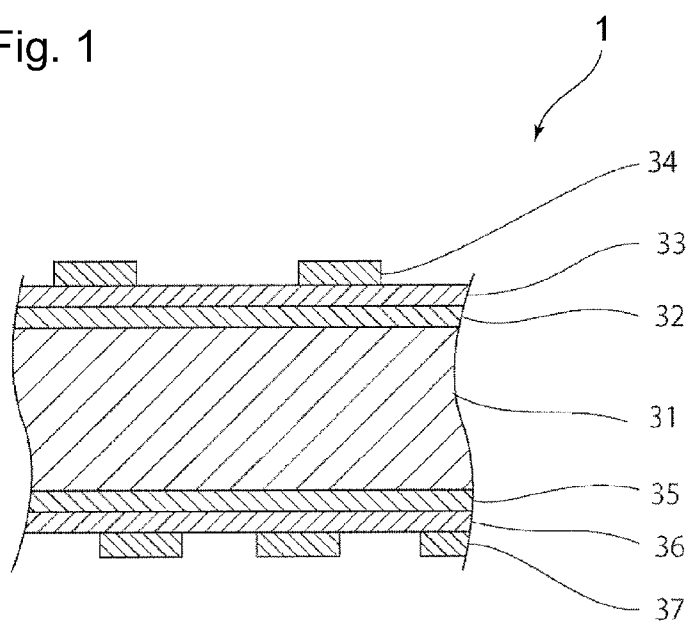
FIG. 1 is a cross-sectional view of a solar cell of an embodiment.

Embodiments are described below. It should be noted, however, that the following embodiments are merely illustrative examples, and the invention is not limited to the following embodiments. Moreover, in the drawings, members having virtually identical functions may be denoted by the same reference signs.

As illustrated in FIG. 1, in this embodiment, solar cell includes substrate 31. Substrate 31 is made of a semiconductor material. Preferably, substrate 31 is made of a crystalline semiconductor material. More preferably, substrate 31 is made of a single-crystal semiconductor material. Specifically, substrate 31 can be formed of, for example, a single-crystal silicon substrate or a polycrystalline silicon substrate.

An indented structure called a textured structure is provided on at least one of main surfaces of substrate 31. It should be noted that the "textured structure" means an indented structure formed to reduce surface reflection and increase the amount of light absorbed by substrate 31. A specific example of the textured structure is an indented structure with pyramid shapes (square pyramid shapes or square frustum shapes) obtained by performing anisotropic etching on a (100) surface of a single-crystal silicon substrate.

N-type semiconductor layer 32 is disposed on one main surface of substrate 31. N-type semiconductor layer 32 can be formed of, for example, n-type amorphous silicon. An i-type semiconductor layer which is thin enough to provide no substantial contribution to power generation and which is made of a substantially intrinsic semiconductor may be provided between n-type semiconductor layer 32 and substrate 31. The i-type semiconductor layer can be formed of, for example, i-type amorphous silicon.

Transparent conductive oxide film 33 as a translucent or transparent film is disposed on n-type semiconductor layer 32. Transparent conductive oxide film 33 can be formed of, for example, indium tin oxide (ITO) or the like.

N-side electrode 34 is disposed on transparent conductive oxide film 33.

P-type semiconductor layer 35 is disposed on other main surface of substrate 31. P-type semiconductor layer 35 can be formed of, for example, p-type amorphous silicon. An i-type semiconductor layer which is thin enough to provide no substantial contribution to power generation and which is made of a substantially intrinsic semiconductor may be provided between p-type semiconductor layer 35 and substrate 31. The i-type semiconductor layer can be formed of, for example, i-type amorphous silicon. By forming p-type semiconductor layer 35 on substrate 31, a pn junction is formed to function as a photoelectric conversion layer.

Transparent conductive oxide film 36 as a translucent or transparent film is disposed on p-type semiconductor layer 35. Transparent conductive oxide film 36 can be formed of, for example, indium tin oxide (ITO) or the like.

P-side electrode 37 is disposed on transparent conductive oxide film 36. It should be noted that in FIG. 1, details of the surface shape of p-side electrode 37 are omitted.

Though not shown in the drawing, solar cells 1 are disposed in a filler layer disposed between a first protective member and a second protective member. For example, the first protective member may be formed of a translucent or transparent plate of glass, resin, or the like, and the second protective member may be formed of a resin sheet or the like. Alternatively, both the first protective member and the second protective member may be formed of a glass plate or a resin plate. The filler layer may be formed of, for example, crosslinkable resin such as ethylene-vinyl acetate copolymer (EVA), non-crosslinkable resin such as polyolefin, or the like. It should be noted that in this specification, a light-receiving surface means a side of solar cell 1 on which the transparent first protective member is disposed, and a back surface means a side of solar cell 1 on which the second protective member is disposed.

Figure 2:
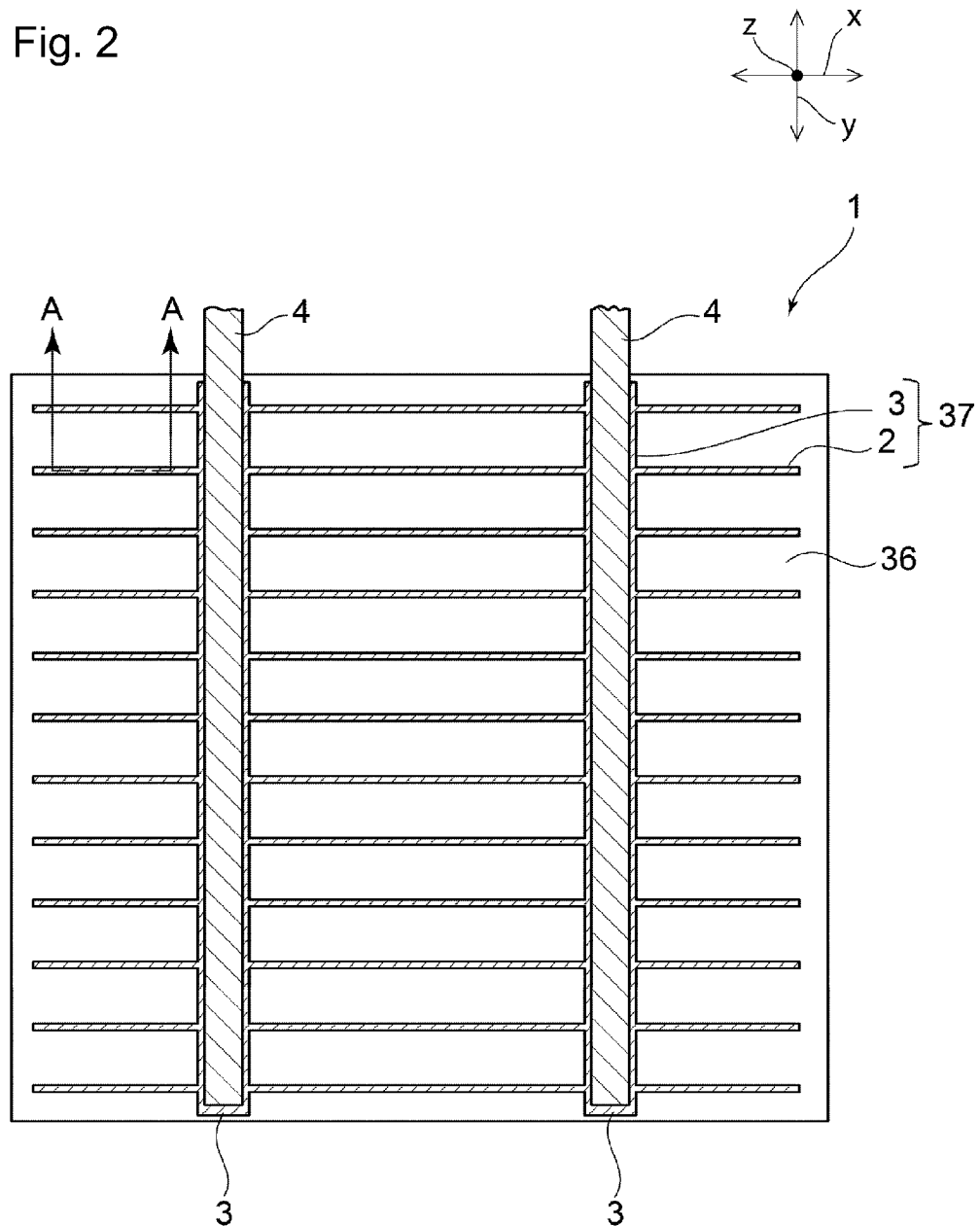
FIG. 2 is a plan view illustrating a back surface of the solar cell of the embodiment.

FIG. 2 is a plan view illustrating a back surface of a solar cell of this embodiment. Accordingly, a surface of the solar cell that is opposite to a light incident side is illustrated. As illustrated in FIG. 2, p-side electrode 37 is formed on transparent conductive oxide film 36 on back surface of solar cell 1, and p-side electrode 37 includes first electrodes 2 as finger electrodes and second electrodes 3 as busbar electrodes. First electrodes 2 are provided to extend in the x direction. Second electrodes 3 are provided to extend in the y direction approximately perpendicular to first electrodes 2. In this embodiment, the number of second electrodes 3 provided is two.

One ends of wiring tabs 4 are electrically connected to surfaces of second electrodes 3. Other ends of wiring tabs 4 are electrically connected to second electrode (busbar electrode) 3 on a front surface of an adjacent solar cell.

Figure 3:
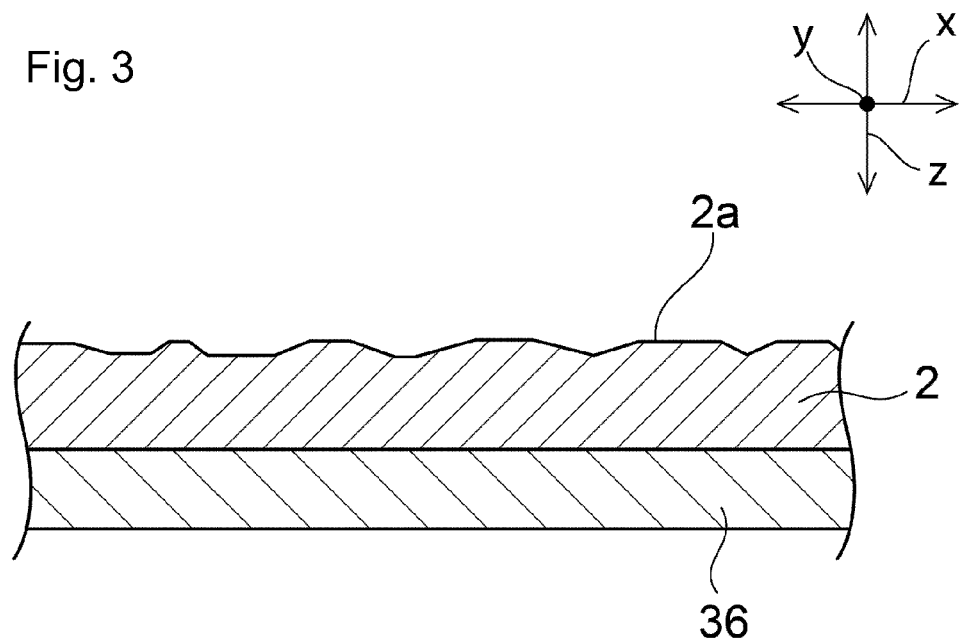
FIG. 3 is a cross-sectional view of a p-side electrode of the embodiment taken along line A-A of FIG. 2.

FIG. 3 is a cross-sectional view of p-side electrode 37 of the embodiment taken along line A-A of FIG. 2. As illustrated in FIG. 3, first electrode 2 as p-side electrode 37 is formed on transparent conductive oxide film 36. Surface 2a of first electrode 2 is a surface with small unevenness, and the average of standard deviations of the heights of unevenness is 5.0 µm or less.

Figure 4:
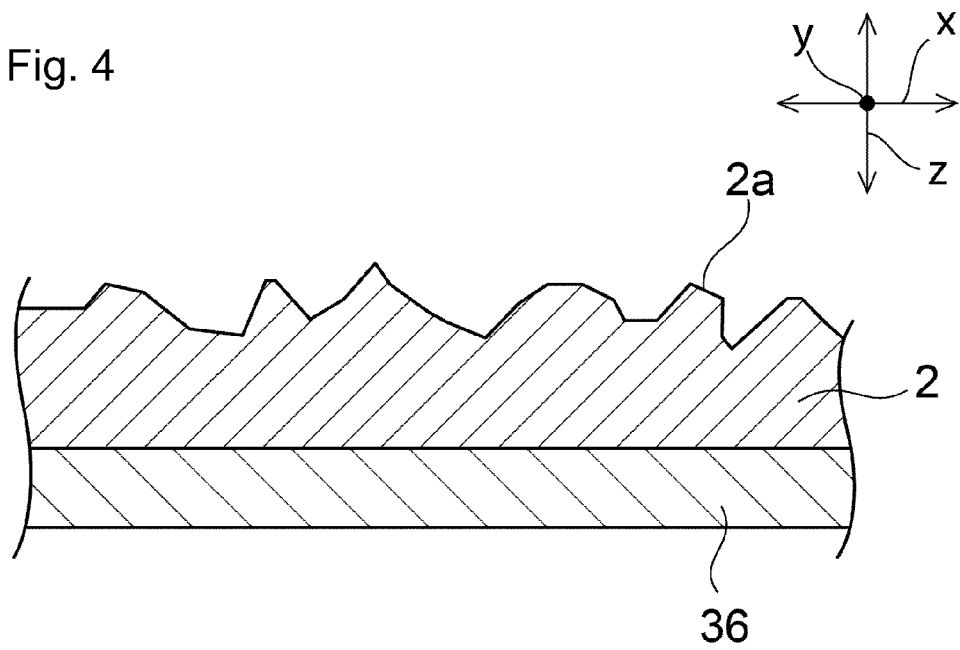
FIG. 4 is a cross-sectional view of a p-side electrode of a reference example.

FIG. 4 is a cross-sectional view of p-side electrode 37 of a reference example. As illustrated in FIG. 4, in the reference example, surface 2a of first electrode 2 is a surface with large unevenness, and the average of standard deviations of the heights of unevenness is larger than 5.0 µm.

P-side electrode 37 can be formed by applying conductive paste by printing. P-side electrode 37 with small unevenness in which the average of standard deviations of the heights of unevenness is 5.0 µm or less, such as illustrated in FIG. 3, can be formed by, for example, increasing the amount of a solvent in the conductive paste or reducing the viscosity of the conductive paste. The printing with the conductive paste may be, for example, screen printing. In that case, p-side electrode 37 in which the average of standard deviations of the heights of unevenness is 5.0 µm or less can also be formed by adjusting a screen plate.

The conductive paste is not particularly limited, but low-temperature curing conductive paste is preferably used. An example of low-temperature curing conductive paste is a conductive paste which thermally cures at temperatures from 150 to 250° C. An example of such a low-temperature curing conductive paste is a conductive paste disclosed in Patent Document 2, which comprises silicone resin, conductive powder, thermosetting components, a curing agent, and a solvent. The thermosetting components may include, for example, epoxy resin with an epoxy equivalent of 1000 or less and epoxy resin with an epoxy equivalent of 1500 or more.

As the silicone resin, a general one can be used. Examples are straight silicone resins such as methyl silicone resin and methylphenyl silicone resin, and modified silicone resins modified with epoxy resin, alkyd resin, polyester, acrylic resin, and the like. These can be used singly or in combination. As the conductive powder, a general one can be used as long as the general one has conductivity. Examples are powder of silver, copper, nickel, aluminum, copper coated with silver, aluminum coated with silver, carbon, and the like. Examples of the thermosetting components are epoxy resins and blocked polyisocyanate compounds. As the curing agent, generally used imidazole and derivatives thereof, tertiary amines, Lewis acids containing boron fluoride, and complexes or salts thereof can be used. The solvent is not particularly limited, but, in the case where the solvent is applied by printing or the like, high-boiling solvents such as ethyl Carbitol acetate, butyl Carbitol acetate, and terpineol can be used.

P-side electrode 37 of the embodiment and p-side electrode 37 of the reference example are formed using the above-described low-temperature curing conductive paste. As the conductive powder, conductive paste containing silver powder is used. It should be noted, however, that the conductive paste used to form p-side electrode 37 of the embodiment contains a larger amount of solvent and has a lower viscosity than the conductive paste used to form p-side electrode 37 of the reference example. Specifically, 10 ml of solvent is added to 3 kg of conductive paste to reduce the viscosity by 10 pa·s.

The conductive paste prepared as described above is applied by printing using a screen plate to form first electrodes 2 as p-side electrode 37. The width (width with respect to the y direction illustrated in FIG. 2) of first electrode 2 is 0.06 mm. A length of 500 µm measured in the direction (x direction illustrated in FIG. 2) in which first electrode 2 extends is set as the length of a measurement sample, and the heights of unevenness on the surface of first electrode are measured. Specifically, using a confocal scanning microscope equipped with a xenon lamp, information on the heights of surface unevenness is imported by a step search method with a height resolution of 2 µm, with a 20× objective lens, with 13.9× optical zoom, in enhanced mode. The obtained information on the heights of unevenness is subjected to a single run of smoothing correction in the X and Y directions with a mask size of 5 in median mode to remove measurement noise.

Figure 6:
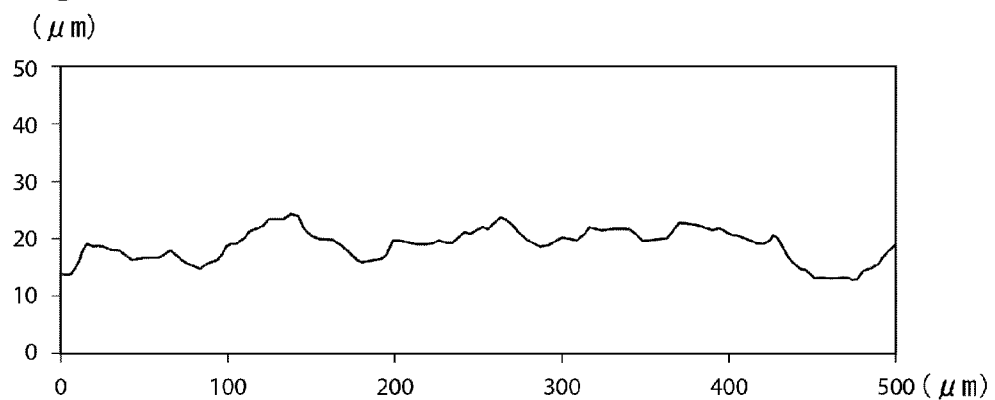
FIG. 6 is a view illustrating the distribution of the heights of unevenness of one measurement sample on the surface of the p-side electrode of the embodiment.
Figure 7:
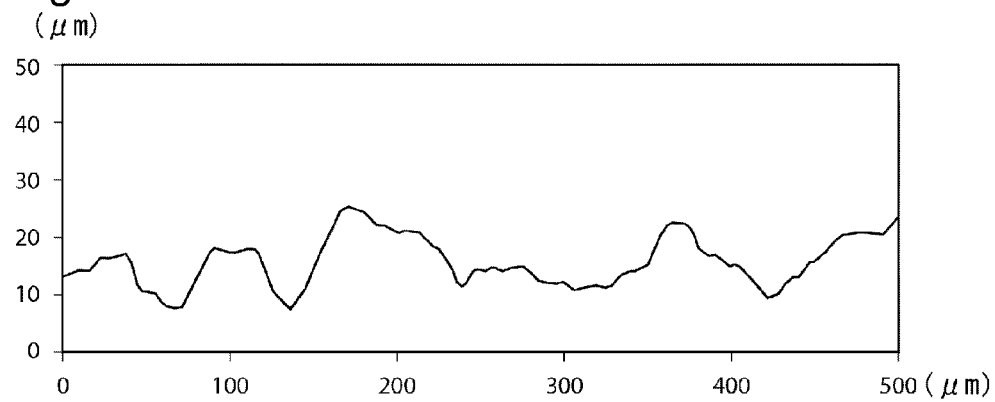
FIG. 7 is a view illustrating the distribution of the heights of unevenness of other measurement sample on the surface of the p-side electrode of the embodiment.

FIG. 6 is a view illustrating the distribution of the heights of unevenness of one measurement sample on the surface of p-side electrode 37 of the embodiment measured as described above. The horizontal axis represents the position of measurement, and represents the distance (µm) from a measurement end position. The vertical axis represents the heights of unevenness (µm). The standard deviation σ of the heights of unevenness illustrated in FIG. 6 is 2.9 µm. FIG. 7 is a view illustrating the distribution of the heights of unevenness of other measurement sample on the surface of p-side electrode 37 measured as described above. The standard deviation σ of the heights of unevenness illustrated in FIG. 7 is 4.9 µm.

Figure 5:
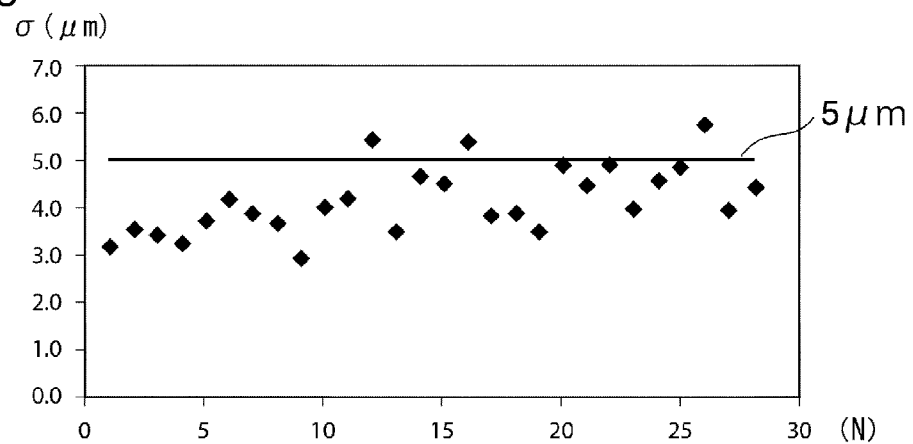
FIG. 5 is a view illustrating standard deviations (the number of measurement samples is 28) of the heights of unevenness on a surface of the p-side electrode of the embodiment.

As described above, a standard deviation σ is found for each of 28 measurement samples, and the respective standard deviations σ of the measurement samples are illustrated in FIG. 5. The horizontal axis represents N-th measurement sample, and the vertical axis represents the standard deviation σ of the measurement sample. The minimum value of the standard deviations σ is 2.9 µm, and the maximum value thereof is 5.8 µm. Moreover, the average of the standard deviations σ of the heights of unevenness on the surface of p-side electrode 37 of this embodiment is 4.2 µm. It should be noted that the average is the arithmetic mean value. The number of samples for calculating the average of standard deviations σ is preferably 20 or more.

For p-side electrode 37 of the reference example, as described above, the standard deviation σ of the heights of unevenness on the surface of the electrode is also found. FIG.

Figure 8:
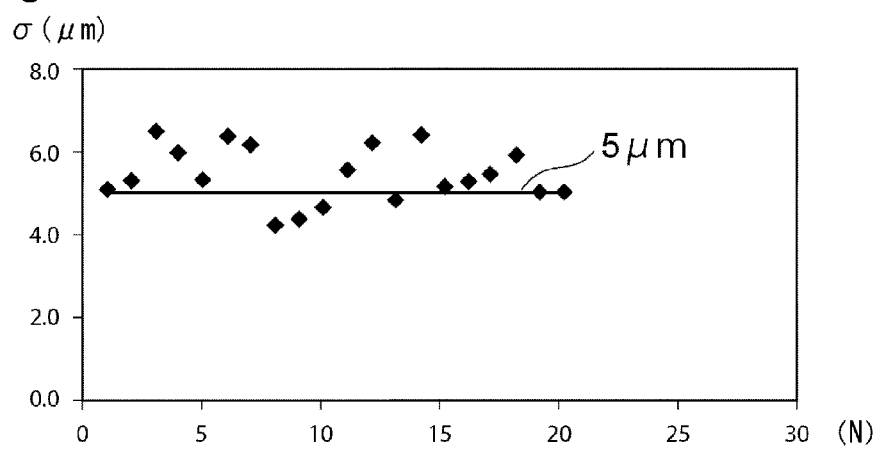
FIG. 8 is a view illustrating standard deviations (the number of measurement samples is 22) of the heights of unevenness on the surface of p-side electrode of the reference example.
Figure 9:
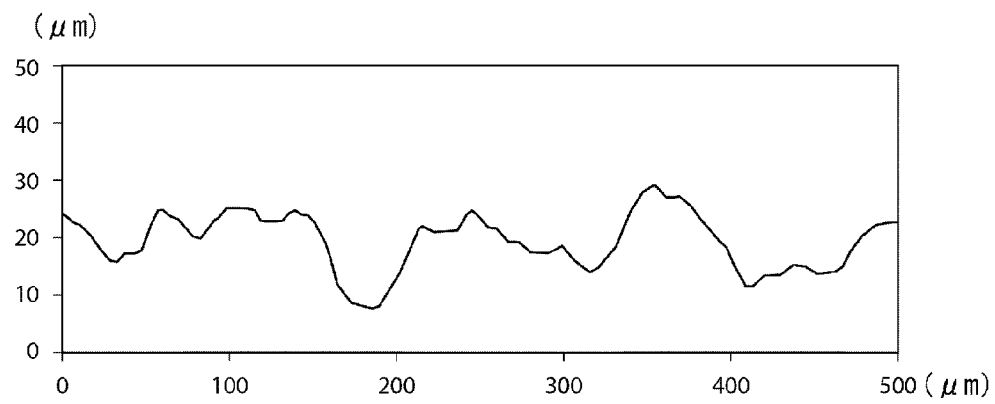
FIG. 9 is a view illustrating the distribution of the heights of unevenness of one sample on the surface of the p-side electrode of the reference example.

9 is a view illustrating the distribution of the heights of unevenness of one measurement sample on the surface of p-side electrode 37 of the reference example. The standard deviation σ of the heights of unevenness illustrated in FIG. 9 is 5.0 μm. FIG. 8 is a view illustrating standard deviations σ of 22 measurement samples. The minimum value of the standard deviations σ is 4.2 μm, and the maximum value thereof is 6.5 μm. Moreover, the average of the standard deviations σ of the heights of unevenness on the surface of p-side electrode 37 of the reference example is 5.4 μm. Accordingly, p-side electrode of the reference example has an average of standard deviations σ out of the range of the embodiment.

The electrical resistance values of p-side electrode 37 of the embodiment and p-side electrode 37 of the reference example are measured to show equivalent values. In the case where p-side electrode 37 of the embodiment is formed, the amount of silver powder in conductive paste can be reduced by 8.0 percent by mass compared to the case where p-side electrode of the reference example is formed. Accordingly, the invention can reduce the loss of conductive paste during the formation of electrodes.

The surface of n-side electrode 34 provided on the light-receiving surface side has a structure similar to that of unevenness shown in the reference example. Specifically, the average of standard deviations of unevenness on the surface of p-side electrode 37 is smaller than the average of standard deviations of unevenness on the surface of n-side electrode 34. From the viewpoint of the electrical resistance value of a finger electrode with respect to the amount of conductive paste used, the average of standard deviations of unevenness on the surface of n-side electrode 34 is also preferably small as in p-side electrode 37. However, if unevenness on the surface of n-side electrode 34 are made large, incident light scatters and reflects, and can be made to re-enter the surface of solar cell 1 to increase power generation. From such a viewpoint, the average of standard deviations unevenness on the surface of p-side electrode 37 is preferably smaller than the average of standard deviations of unevenness on the surface of n-side electrode 34.

It should be noted that though a pn junction is formed on the back surface side in the solar cell of the embodiment, a pn junction may be formed on the light-receiving surface side. In that case, an n-side electrode provided on the back surface side is formed such that the average of standard deviations of the heights of unevenness on the surface thereof is 5.0 μm or less.

In electrodes of a solar cell that are formed of conductive paste, it is desired that the loss of conductive paste during the formation of the electrodes can be reduced without increasing the resistance values of the electrodes. The embodiments explained above provide a solar cell in which the loss of conductive paste during the formation of electrodes can be reduced.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A solar cell comprising:
   a photoelectric conversion layer including a substrate wherein the substrate formed of a semiconductor material;
   a first finger electrode formed of printed conductive paste at a first main surface side of the photoelectric conversion layer, the printed conductive paste comprising conductive powder, the first finger electrode being arranged on a back surface side of the solar cell opposite to a light-receiving surface side, and
   a second finger electrode formed of printed conductive paste at a second main surface side of the photoelectric conversion layer, the printed conductive paste comprising conductive powder, the second finger electrode being arranged on the light-receiving surface side of the solar cell,
   wherein the first finger electrode comprises a first uneven surface on an opposite side of the first main surface of the photoelectric conversion layer and the second finger electrode comprises a second uneven surface on an opposite side of the second main surface of the photoelectric conversion layer,
   an average of standard deviations of heights of unevenness on the first uneven surface of the first finger electrode is 5.0 μm or less, and
   the average of the standard deviations of the heights of the unevenness on the first uneven surface of the first finger electrode is smaller than an average of standard deviations of heights of unevenness on the second uneven surface of the second finger electrode, a height of each unevenness of the first uneven surface being defined as a distance from the first main surface of the photoelectric conversion layer to the first uneven surface, a height of each unevenness of the second uneven surface being defined as a distance from the second main surface of the photoelectric conversion layer to the second uneven surface.

2. The solar cell according to claim 1, wherein
   the substrate is a crystalline silicon substrate,
   the photoelectric conversion layer further comprises:
   an amorphous silicon layer formed on the crystalline silicon substrate; and
   a transparent conductive oxide film formed on the amorphous silicon layer and
   the first finger electrode is provided on the transparent conductive oxide film.

3. The solar cell according to claim 2, wherein
   the amorphous silicon layer comprises a first amorphous silicon layer of a first conductivity type and a substantially intrinsic second amorphous silicon layer provided between the first amorphous silicon layer and the crystalline silicon substrate.

4. The solar cell according to claim 1, wherein
   the substrate is a crystalline silicon substrate,
   the photoelectric conversion layer further comprises:
   a first amorphous silicon layer of a first conductivity type, the first amorphous silicon layer being formed on the back surface side of the crystalline silicon substrate;
   a substantially intrinsic second amorphous silicon layer provided between the first amorphous silicon layer and the crystalline silicon substrate;
   a third amorphous silicon layer of a second conductivity type different from the first conductivity type, the third amorphous silicon layer being formed on the light-receiving surface side of the crystalline silicon substrate;

a substantially intrinsic fourth amorphous silicon layer provided between the third amorphous silicon layer and the crystalline silicon substrate;
a first transparent conductive oxide film formed on the first amorphous silicon layer; and
a second transparent conductive oxide film formed on the third amorphous silicon layer, and
the first finger electrode is provided on the first transparent conductive oxide film, and the second finger electrode is provided on the second transparent conductive oxide film.

5. The solar cell according to claim 1, wherein an average of the standard deviations is an average obtained from 20 or more measurement samples in the first finger electrode.

6. The solar cell according to claim 1, wherein the printed conductive paste is low-temperature curing conductive paste.

7. The solar cell according to claim 6, wherein the printed conductive paste thermally cures at temperatures from 150 to 250° C.

8. The solar cell according to claim 7, wherein the printed conductive paste comprises silicone resin, conductive powder, thermosetting components, a curing agent, and a solvent.

9. The solar cell according to claim 8, wherein the thermosetting components comprises epoxy resin with an epoxy equivalent of 1000 or less and epoxy resin with an epoxy equivalent of 1500 or more.

10. The solar cell according to claim 8, wherein the silicone resin comprises at least one of straight silicone resins such as methyl silicone resin and methylphenyl silicone resin, and modified silicone resins modified with epoxy resin, alkyd resin, polyester, and acrylic resin.

11. The solar cell according to claim 8, wherein the conductive powder comprises at least one of powder of silver, copper, nickel, aluminum, copper coated with silver, aluminum coated with silver, and carbon.

12. The solar cell according to claim 8, wherein the thermosetting components comprises at least one of epoxy resins and blocked polyisocyanate compounds.

13. The solar cell according to claim 8, wherein the curing agent comprises at least one of imidazole and derivatives thereof, tertiary amines, Lewis acids containing boron fluoride, and complexes or salts thereof.

14. The solar cell according to claim 8, wherein the solvent comprises at least one of high-boiling solvents such as ethyl Carbitol acetate, butyl Carbitol acetate, and terpineol.

15. The solar cell according to claim 1, wherein a first ratio of the conductive powder to the printed conductive paste for the first finger electrode is smaller than a second ratio of the conductive powder to the printed conductive paste for the second finger electrode.

16. The solar cell according to claim 15, wherein the first ratio is a mass ratio of a mass of the conductive powder to a mass of the printed conductive paste for the first finger electrode, and
the second ratio is a mass ratio of a mass of the conductive powder to a mass of the printed conductive paste for the second finger electrode.

* * * * *